US010045414B1

United States Patent
Chang et al.

(12) United States Patent (10) Patent No.: US 10,045,414 B1
Chang et al. (45) Date of Patent: Aug. 7, 2018

(54) METHOD AND APPARATUS FOR INCREASING LUMINOUS INTENSITY OF AN ULTRAVIOLET LIGHT EMITTING DIODE

(71) Applicant: NATIONAL SUN YAT-SEN UNIVERSITY, Kaohsiung (TW)

(72) Inventors: Ting-Chang Chang, Kaohsiung (TW); Kuan-Chang Chang, Kaohsiung (TW); Tsung-Ming Tsai, Kaohsiung (TW); Chih-Cheng Shih, Kaohsiung (TW); Bo-Wei Chen, Kaohsiung (TW); Chung-I Yang, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 0 days.

(21) Appl. No.: 15/597,238

(22) Filed: May 17, 2017

(30) Foreign Application Priority Data

Feb. 7, 2017 (TW) .............................. 106103988 A

(51) Int. Cl.
*H01J 7/24* (2006.01)
*H05B 33/08* (2006.01)
*H01L 33/62* (2010.01)

(52) U.S. Cl.
CPC ......... *H05B 33/0854* (2013.01); *H01L 33/62* (2013.01)

(58) Field of Classification Search
CPC ........... H01L 21/3105; H01L 21/31058; H01L 21/31612; H01L 33/62; H05B 33/0854
USPC ......................................... 315/112, 115, 118
See application file for complete search history.

(56) References Cited

U.S. PATENT DOCUMENTS

| 8,928,256 | B2* | 1/2015 | Smith | ................ H05B 33/0842 |
| | | | | 315/309 |
| 2006/0121602 | A1* | 6/2006 | Hoshizaki | ............ G01N 21/645 |
| | | | | 435/288.7 |
| 2008/0063809 | A1* | 3/2008 | Lee | ...................... H01L 21/3105 |
| | | | | 427/558 |
| 2011/0147466 | A1* | 6/2011 | Kang | .................... H01L 25/167 |
| | | | | 235/492 |
| 2011/0148270 | A1* | 6/2011 | Bhairi | ...................... F21V 5/04 |
| | | | | 313/46 |

* cited by examiner

*Primary Examiner* — Tung X Le
(74) *Attorney, Agent, or Firm* — Alan D. Kamrath; Kamrath IP Lawfirm, P.A.

(57) ABSTRACT

A method for increasing the luminous intensity of an ultraviolet light emitting diode includes heating an ultraviolet light emitting diode to a working temperature, and supplying electricity to the ultraviolet light emitting diode at the working temperature to make the ultraviolet light emitting diode emit ultraviolet light. An apparatus for increasing the luminous intensity of an ultraviolet light emitting diode includes a substrate, an ultraviolet light emitting diode mounted on the substrate, an electric heater mounted on the substrate, a temperature sensor, and a controller electrically connected to the ultraviolet light emitting diode, the electric heater, and the temperature sensor. The controller can heat the ultraviolet light emitting diode through the substrate. When the temperature sensor detects that the temperature of the ultraviolet light emitting diode reaches a working temperature, the controller supplies electricity to the ultraviolet light emitting diode to make the ultraviolet light emitting diode emit ultraviolet light.

10 Claims, 3 Drawing Sheets

METHOD AND APPARATUS FOR INCREASING LUMINOUS INTENSITY OF AN ULTRAVIOLET LIGHT EMITTING DIODE

BACKGROUND OF THE INVENTION

Cross Reference to Related Applications

The application claims the benefit of Taiwan application serial No. 106103988, filed on Feb. 7, 2017, and the entire contents of which are incorporated herein by reference.

1. Field of the Invention

The present invention relates to a method and an apparatus for improving performances of an electronic element and, more particularly, to a method and an apparatus for increasing the luminous intensity of an ultraviolet light emitting diode.

2. Description of the Related Art

With the progress of semiconductor technology, semiconductors, such as light emitting diodes, having different functions have been developed for various electronic devices.

Taking an ultraviolet light emitting diode as an example, a conventional lighting element can emit light when supplied with D.C. power. Theoretically, the luminous intensity of the lighting element is in direct proportion to the current of the lighting element. However, the current of the lighting element is related to the working temperature. Under the conventional conditions of use, the luminous intensity decreases as the working temperature of the lighting element increases, as shown in FIG. 1.

Thus, the prior art is inconvenient in use. Improvement is, therefore, required to improve the utility.

SUMMARY OF THE INVENTION

An objective of the present invention is to provide a method and an apparatus for increasing the luminous intensity of an ultraviolet light emitting diode without changing current procedures for production of the ultraviolet light emitting diode.

Another objective of the present invention is to provide a method and an apparatus for increasing the luminous intensity of an ultraviolet light emitting diode without modifying the structure of the ultraviolet light emitting diode.

A method for increasing the luminous intensity of an ultraviolet light emitting diode according to the present invention includes heating an ultraviolet light emitting diode to a working temperature, and supplying electricity to the ultraviolet light emitting diode at the working temperature to make the ultraviolet light emitting diode emit ultraviolet light.

In an example, the ultraviolet light emitting diode is mounted on a substrate, and the ultraviolet light emitting diode is heated through the substrate.

An apparatus for increasing the luminous intensity of an ultraviolet light emitting diode according to the present invention includes a substrate, an ultraviolet light emitting diode mounted on the substrate, an electric heater mounted on the substrate, a temperature sensor for detecting a temperature of the ultraviolet light emitting diode, and a controller electrically connected to the ultraviolet light emitting diode, the electric heater, and the temperature sensor. The controller is configured to heat the ultraviolet light emitting diode through the substrate. When the temperature sensor detects that the temperature of the ultraviolet light emitting diode reaches a working temperature, the controller supplies electricity to the ultraviolet light emitting diode to make the ultraviolet light emitting diode emit ultraviolet light.

In an example, the working temperature is in a range between 90° C. and 110° C. The electric heater can be located adjacent to the ultraviolet light emitting diode. The ultraviolet light emitting diode and the electric heater can be respectively mounted on two opposite sides of the substrate or on the same side of the substrate. The controller can be a microcontroller unit or a digital signal processer. The temperature sensor can be a thermistor, a platinum resistor temperature sensor, or a thermocouple. The electric heater can be a cooling chip having a hot end.

In the method and apparatus for increasing the luminous intensity of an ultraviolet light emitting diode according to the present invention, the current ultraviolet light emitting diode can be preheated before the supply of electricity. The ultraviolet light emitting diode can be supplied with electricity after having been heated to the working temperature. Thus, the luminous intensity of the ultraviolet light emitting diode can be increased to increase the optical/electrical conversion efficiency and the lighting effect.

The present invention will become clearer in light of the following detailed description of illustrative embodiments of this invention described in connection with the drawings.

DETAILED DESCRIPTION OF THE INVENTION

Figure 2:
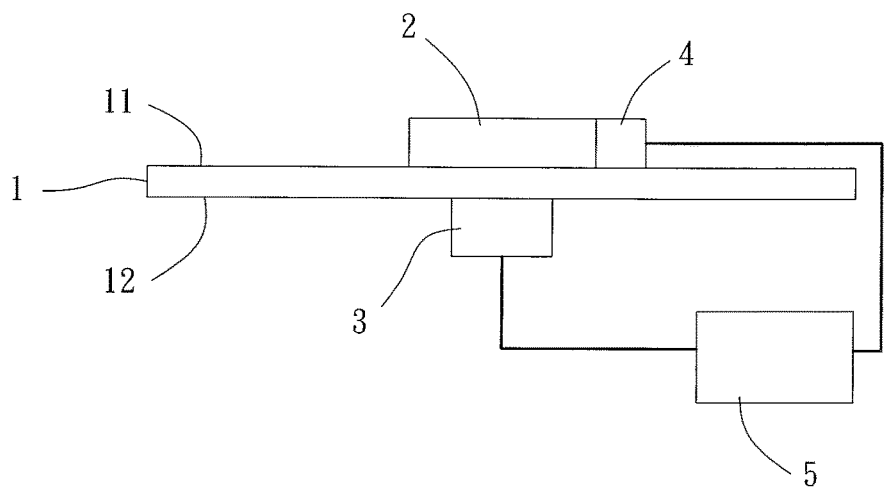
FIG. 2 is a diagrammatic block diagram of an apparatus for increasing the luminous intensity of an ultraviolet light emitting diode of an embodiment according to the present invention.

FIG. 2 is a diagrammatic block diagram of an apparatus for increasing the luminous intensity of an ultraviolet light emitting diode of an embodiment according to the present invention. The apparatus for increasing the luminous intensity of an ultraviolet light emitting diode of this embodiment includes a substrate 1, an ultraviolet light emitting diode 2, an electric heater 3, a temperature sensor 4, and a controller 5. The substrate 1 is used for mounting the ultraviolet light emitting diode 2, the electric heater 3, and the temperature sensor 4. The controller 5 is electrically connected to the ultraviolet light emitting diode 2, the electric heater 3, and the temperature sensor 4. Non-restrictive examples according to the present invention will be set forth hereinafter.

With reference to FIG. 2, the substrate 1 can be made of an electrically insulating material suitable for heat conduction, such as a substrate for an ultraviolet light emitting diode. The substrate 1 includes two opposite sides 11 and 12. The ultraviolet light emitting diode 2 can be of a conventional design. Both of the ultraviolet light emitting diode 2 and the electric heater 3 are mounted to the substrate 1. The electric heater 3 is an electric element that generates heat, such as a cooling chip having a hot end. The electric heater 3 can be located adjacent to the ultraviolet light emitting diode 2. For example, the ultraviolet light emitting diode 2 and the electric heater 3 are mounted on different sides 11 and 12 or the same side (such as the side 11) of the substrate 1. The temperature sensor 4 can be, but not limited to, an electric element capable of detecting temperature, such as a thermistor, a platinum resistor temperature sensor, or a thermocouple. The temperature sensor 4 can detect the temperature of the ultraviolet light emitting diode 2.

With reference to FIG. 2, in this embodiment, the controller 5 is an electric element capable of storing data, generating signals, and providing surveillance, such as a microcontroller unit (MCU) or a digital signal processor (DSP). The controller 5 can execute a control program and can store data required for executing the control program. The controller 5 can control the electric heater 3 to heat the ultraviolet light emitting diode 2 through the base 1. When the temperature sensor 4 detects that the temperature of the ultraviolet light emitting diode 2 increases to a working temperature which can range from 90° C. to 110° C., the controller 5 supplies electricity to the ultraviolet light emitting diode 2 to emit ultraviolet light. For example, the ultraviolet light emitting diode 2 can receive D.C. power larger than the conductive voltage value of the ultraviolet light emitting diode to emit ultraviolet light, which can be appreciated by one having ordinary skill in the art.

Figure 3:
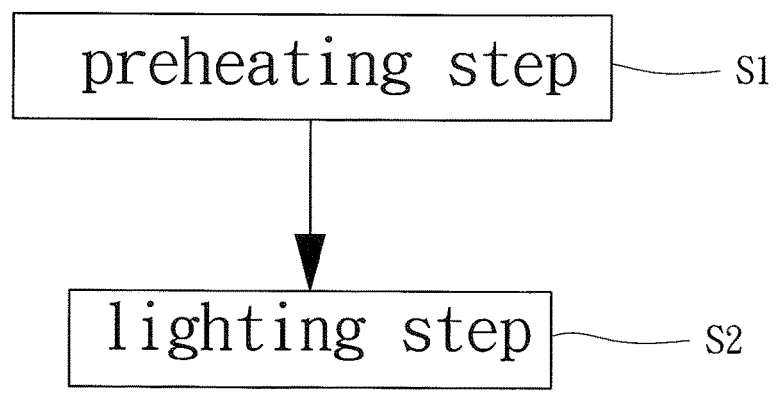
FIG. 3 is a diagrammatic block diagram illustrating a method for increasing the luminous intensity of an ultraviolet light emitting diode of an embodiment according to the present invention.

FIG. 3 is a diagrammatic block diagram illustrating a method for increasing the luminous intensity of an ultraviolet light emitting diode of an embodiment according to the present invention. With reference to FIGS. 2 and 3, the method for increasing the luminous intensity of an ultraviolet light emitting diode includes a preheating step S1 and a lighting step S2. The preheating step S1 includes heating the ultraviolet light emitting diode 2 to the working temperature. For example, the ultraviolet light emitting diode 2 is heated through the substrate 1. The lighting step S2 includes supplying electricity to the ultraviolet light emitting diode 2 at the working temperature to make the ultraviolet light emitting diode 2 emit ultraviolet light.

Figure 1:
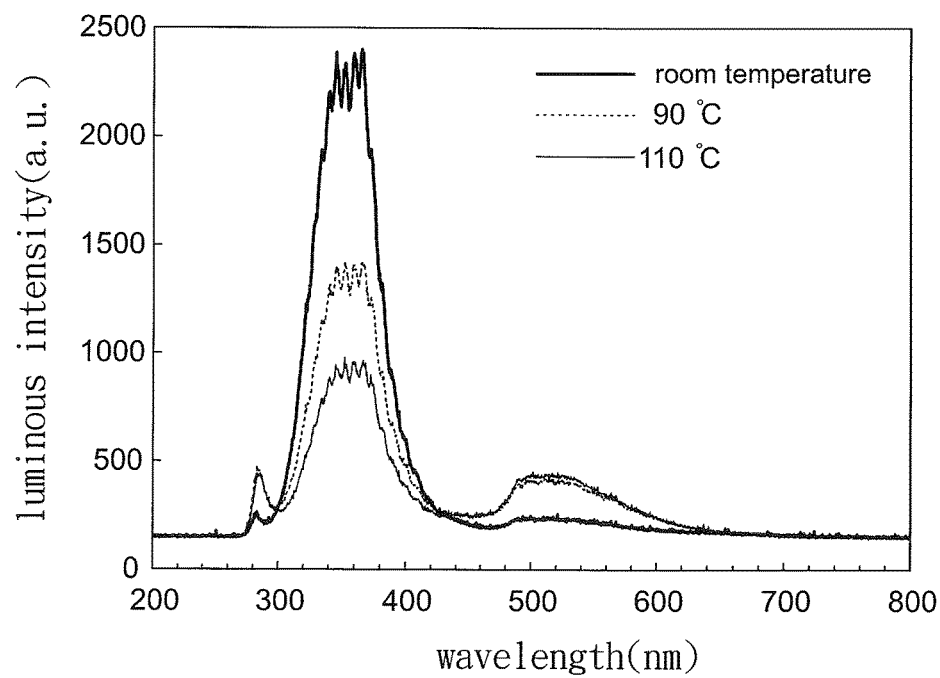
FIG. 1 is a luminous intensity-temperature diagram of a conventional ultralight light emitting diode.
Figure 4:
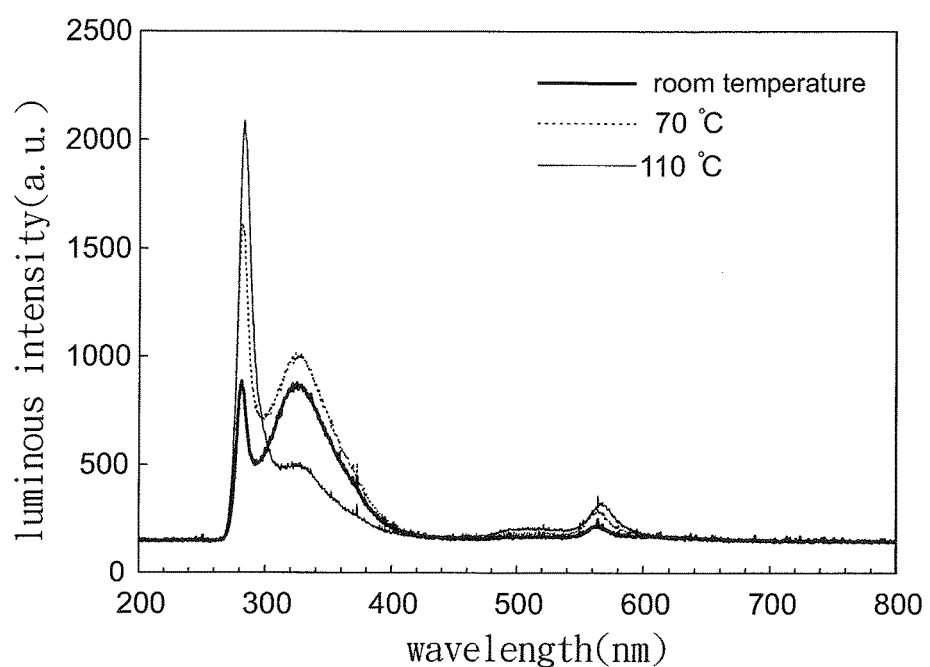
FIG. 4 is a luminous intensity-temperature diagram of an ultraviolet light emitting diode according to the present invention.

In use of the embodiment according to the present invention, the electric heater 3 preheats the ultraviolet light emitting diode 2 to the working temperature, and the controller 5 supplies electricity to the ultraviolet light emitting diode 2 that has been preheated to the working temperature, making the ultraviolet light emitting diode 2 emit ultraviolet light. As shown in FIG. 4, the luminous intensity of the ultraviolet light emitting diode 2 increases as the working temperature increases. In comparison with the luminous intensity of the conventional ultraviolet light emitting diode 2 that is supplied with electricity without preheating (see FIG. 1), the luminous intensity of the ultraviolet light emitting diode 2 according to the present invention that has been preheated to the working temperature can be reliably increased when the driving current is the same.

Thus, in the above embodiment according to the present invention, the current ultraviolet light emitting diode 2 can be preheated before the supply of electricity. The ultraviolet light emitting diode 2 can be supplied with electricity after having been heated to the working temperature. Thus, the luminous intensity of the ultraviolet light emitting diode 2 can be increased to increase the optical/electrical conversion efficiency and the lighting effect.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A method for increasing the luminous intensity of an ultraviolet light emitting diode, comprising:
   mounting the ultraviolet light emitting diode on a substrate, with an electric heater mounted on the substrate;
   using a controller to control the electric heater to heat the ultraviolet light emitting diode through the substrate, and using a temperature sensor to detect a temperature of the ultraviolet light emitting diode;
   using the controller to supply electricity to the ultraviolet light emitting diode when the ultraviolet light emitting diode reaches a working temperature; and
   making the ultraviolet light emitting diode to emit an ultraviolet light.

2. The method for increasing the luminous intensity of the ultraviolet light emitting diode as claimed in claim 1, wherein the working temperature is in a range between 90° C. and 110° C.

3. An apparatus for increasing the luminous intensity of the ultraviolet light emitting diode, comprising:
   a substrate;
   the ultraviolet light emitting diode mounted on the substrate;
   an electric heater mounted on the substrate;
   a temperature sensor for detecting a temperature of the ultraviolet light emitting diode; and
   a controller electrically connected to the ultraviolet light emitting diode, the electric heater, and the temperature sensor, wherein the controller is configured to heat the ultraviolet light emitting diode through the substrate, wherein when the temperature sensor detects that the temperature of the ultraviolet light emitting diode reaches a working temperature, the controller supplies electricity to the ultraviolet light emitting diode to make the ultraviolet light emitting diode to emit an ultraviolet light.

4. The apparatus for increasing the luminous intensity of the ultraviolet light emitting diode as claimed in claim 3, wherein the working temperature is in a range between 90° C. and 110° C.

5. The apparatus for increasing the luminous intensity of the ultraviolet light emitting diode as claimed in claim 3, wherein the electric heater is located adjacent to the ultraviolet light emitting diode.

6. The apparatus for increasing the luminous intensity of the ultraviolet light emitting diode as claimed in claim 3, wherein the substrate includes two opposite sides, and wherein the ultraviolet light emitting diode and the electric heater are respectively mounted on the two opposite sides of the substrate.

7. The apparatus for increasing the luminous intensity of the ultraviolet light emitting diode as claimed in claim 3, wherein the ultraviolet light emitting diode and the electric heater are mounted on a same side of the substrate.

8. The apparatus for increasing the luminous intensity of the ultraviolet light emitting diode as claimed in claim 3, wherein the controller is a microcontroller unit or a digital signal processes.

9. The apparatus for increasing the luminous intensity of the ultraviolet light emitting diode as claimed in claim 3, wherein the temperature sensor is a thermistor, a platinum resistor temperature sensor, or a thermocouple.

10. The apparatus for increasing the luminous intensity of the ultraviolet light emitting diode as claimed in claim 3, wherein the electric heater is a cooling chip having a hot end.

\* \* \* \* \*